(12) United States Patent
Lippmann et al.

(10) Patent No.: US 6,623,142 B1
(45) Date of Patent: Sep. 23, 2003

(54) METHOD AND APPARATUS FOR CORRECTING OPTICAL NON-UNIFORMITIES IN A LIGHT EMITTING DIODE

(75) Inventors: Ray Lippmann, Flint, MI (US); Gail M. Sylvester, Frankenmuth, MI (US); Mark J. Miller, Grand Blanc, MI (US); Ronald Kenneth Selby, Flint, MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/077,140

(22) Filed: Feb. 15, 2002

(51) Int. Cl.⁷ .................................................. F21V 9/16
(52) U.S. Cl. ........................ 362/293; 362/800; 359/888
(58) Field of Search ................................. 359/887, 888, 359/890, 891; 356/416, 402, 420, 425; 445/3, 4; 362/293, 800; 313/512, 111, 112

(56) References Cited

U.S. PATENT DOCUMENTS

| | | | | | |
|---|---|---|---|---|---|
| 3,756,725 A | * | 9/1973 | Manring | ...................... | 356/425 |
| 4,013,915 A | * | 3/1977 | Dufft | ........................... | 313/112 |
| 4,152,618 A | * | 5/1979 | Abe et al. | .................... | 313/512 |
| 4,168,102 A | * | 9/1979 | Chida et al. | ................. | 313/111 |
| 4,758,764 A | * | 7/1988 | Kuga et al. | .................. | 313/512 |
| 4,812,635 A | * | 3/1989 | Kaufmann et al. | ......... | 359/888 |
| 4,928,008 A | * | 5/1990 | Huggins et al. | ............. | 359/888 |
| 5,731,898 A | * | 3/1998 | Orzi et al. | ................... | 359/891 |
| 5,760,910 A | * | 6/1998 | Lepper et al. | ............... | 356/416 |
| 5,962,971 A | * | 10/1999 | Chen | ........................... | 313/512 |
| 6,016,038 A | | 1/2000 | Mueller et al. | ............. | 315/291 |
| 6,127,783 A | * | 10/2000 | Pashley et al. | ............. | 315/149 |
| 6,150,774 A | | 11/2000 | Mueller et al. | ............. | 315/291 |
| 6,490,037 B1 | * | 12/2002 | Schmitt | ....................... | 356/416 |

* cited by examiner

Primary Examiner—Alan Cariaso
(74) Attorney, Agent, or Firm—Stefan V. Chmielewski

(57) ABSTRACT

The invention adjusts the spectral characteristics of a light emitting diode (LEDs) by placing a filter in the LEDs light emission path. The filter is printed on the lens of the LED or printed on a cap that is later attached to the LED via ink jet printing or another printing method. The specific ink colors selected for the filter depend on the deviation of each LED from a specified tolerance. The filters create a high degree of color and intensity uniformity without requiring labor and cost-intensive binning.

14 Claims, 3 Drawing Sheets

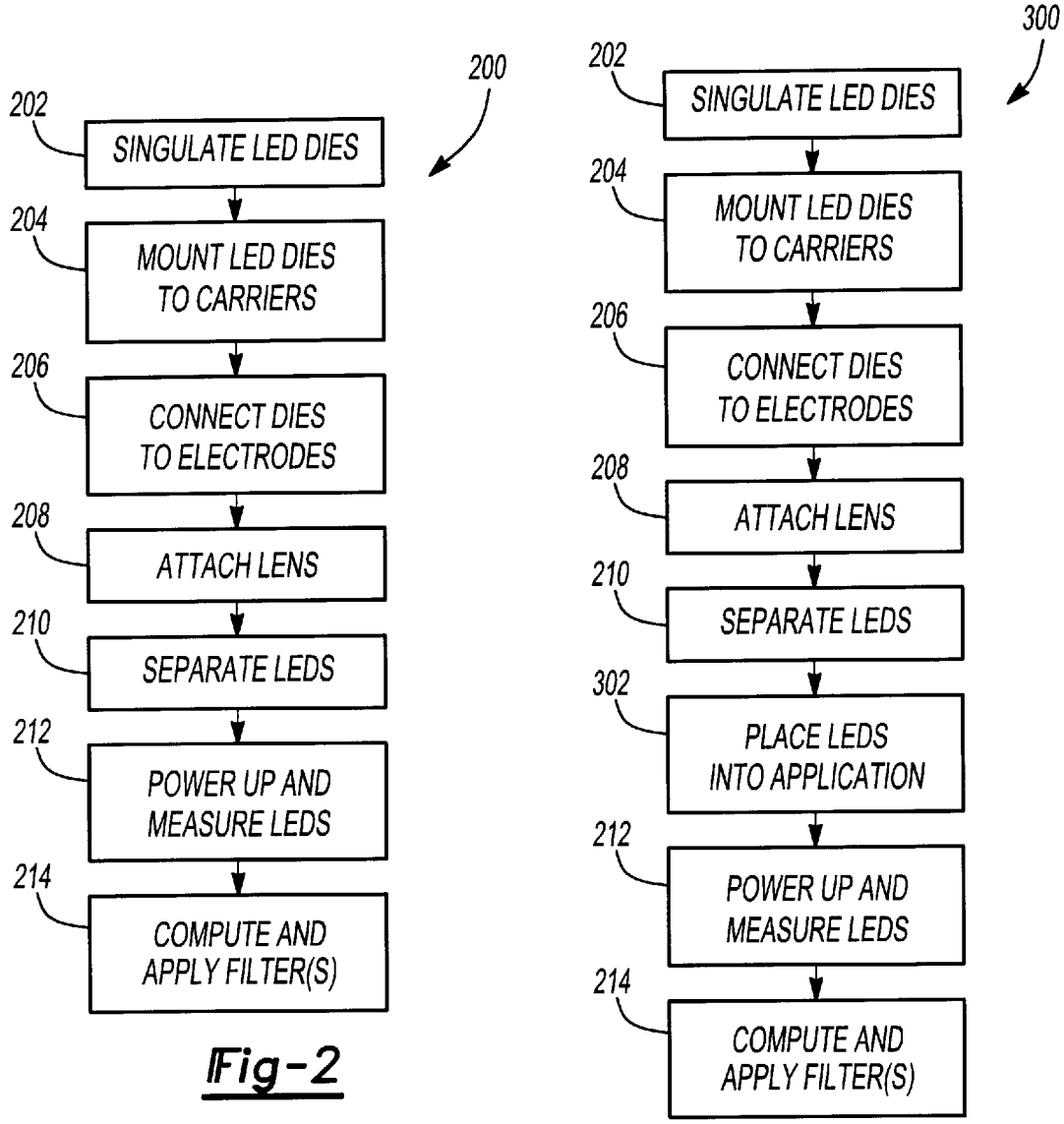

METHOD AND APPARATUS FOR CORRECTING OPTICAL NON-UNIFORMITIES IN A LIGHT EMITTING DIODE

TECHNICAL FIELD

The present invention relates to light emitting diodes (LEDs) and more particularly to LEDs having color and intensity correction.

BACKGROUND OF THE INVENTION

Light emitting diodes (LEDs) appear in many different applications, such as illuminating controls, automotive signals, and displays. Many applications use multiple LEDs in a single device, but color and light intensity tolerance ranges for LEDs can be large and result in a non-uniform appearance, both within a single device and across multiple devices. To accommodate these wide color and intensity variations, LED manufacturers often sort each LED into a particular color and/or intensity "bin", thereby minimizing variances within a selected LED group. For example, if a manufacturer sorts LEDs by intensity, a single bin may contain parts that have a luminous intensity range of 100 to 200 millicandela.

If a high-volume end user requires LEDs having the specific characteristics exhibited in one intensity and/or color bin, the LED manufacturer must produce a sufficient quantity of LEDs for that bin as a percentage of all of the LED dies produced for a target color. Tight bin tolerances cause the LEDs contained in that bin to constitute a small portion of the total LED yield. It may be necessary for the user to accept multiple adjacent bins to fulfill quantity requirements. This process tends to be expensive and impractical for large production quantities because shortages may occur if the bins meeting production criteria constitute a relatively small fraction of the LED manufacturer's overall production.

The problem is further complicated when an application requires color mixing of LEDs because the large tolerances for individual LEDs are magnified during color mixing, resulting in substantial, noticeable system level color variations.

There is a need for a method and system that reduces color and intensity variations in LEDs.

SUMMARY OF THE INVENTION

Accordingly, the present invention is directed to a light emitting diode (LED), comprising an LED die that emits light in an optical path and a filter disposed in the optical path, wherein the filter has a filter pattern that changes at least one of the color and the intensity of the emitted light, wherein the filter pattern is generated based on a shift value corresponding to a deviation between at least one of the color and intensity of the emitted light from a reference.

The invention is also directed to an apparatus having at least one light emitting diode (LED), comprising at least one LED die that emits light in an optical path, at least one LED lens in the optical path of said at least one LED die, and at least one filter disposed on said at least one LED lens, wherein the filter is a printed ink pattern that changes at least one of the color and the intensity of the emitted light, wherein the filter pattern is generated based on a shift value corresponding to a deviation between at least one of the color and intensity of the emitted light from a reference.

The invention is further directed to a method for correcting at least one of a color and intensity of emitted light along an optical path from an LED die, comprising the steps of measuring at least one of the color and intensity of the emitted light, comparing said at least one of the color and intensity of the emitted light with a reference to obtain a shift value, and placing a filter in the optical path, wherein the filter has a filter pattern that changes at least one of the color and the intensity of the emitted light based on the shift value.

BRIEF DESCRIPTION OF THE DRAWINGS

The present invention will now be described, by way of example, with reference to the accompanying drawings, in which:

FIG. 2 is a block diagram illustrating an embodiment of an LED manufacturing process according to the present invention;

FIG. 3 is a block diagram illustrating another embodiment of an LED manufacturing process according to the present invention.

DESCRIPTION OF THE PREFERRED EMBODIMENTS

Figure 1A:
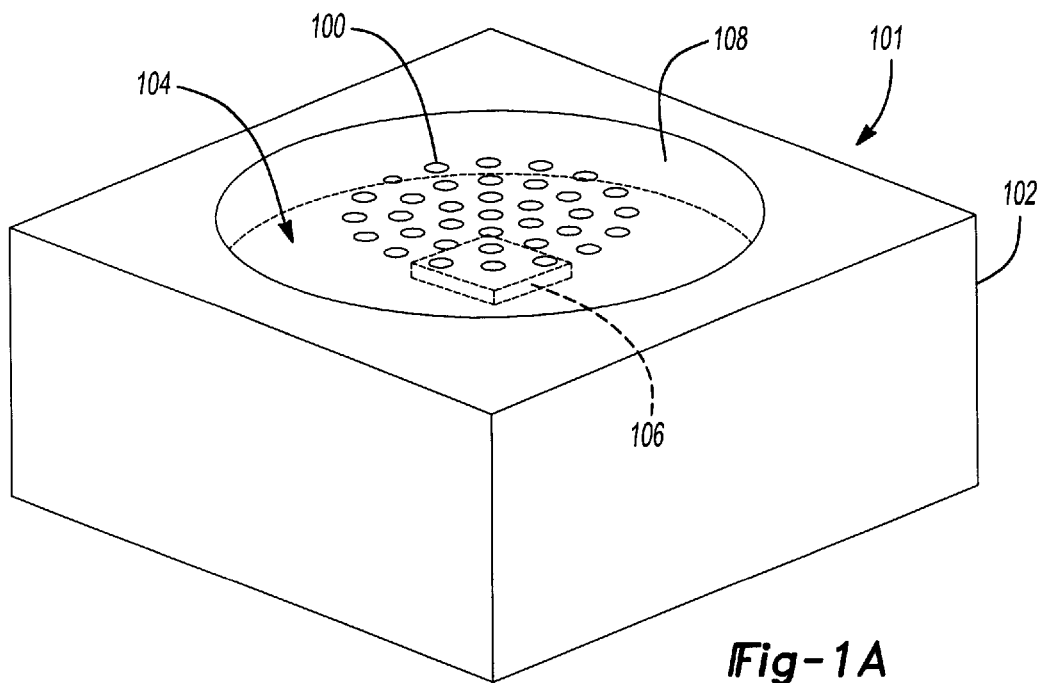
FIGS. 1a and 1b illustrate two possible embodiments of an LED structure according to the present invention.

The invention is directed to reducing variations in the intensity and/or the color of individual LEDs or a group of LEDs within a given application. Generally, the invention compensates for LED variations by applying a filter 100 having a filter pattern to individual LEDs based on each LEDs deviation from a selected reference. The filter may be added during the LED manufacturing process or during assembly of the particular application in which the LED is used or, alternatively, as a separate and independent operation.

FIG. 1 shows one possible implementation of the inventive filter 100 on a surface mount LED package. Note that the inventive technique could be applied to radial and subminiature LED packages without departing from the scope of the invention. In one embodiment, the LED 101 includes an LED carrier 102 having a cavity 104 that houses an LED die 106. Clear epoxy deposited inside the cavity 104 holds the LED die 106 in place and acts as an LED lens 108 that protects the LED die 106 without affecting its light emitting characteristics. The filter 100 is disposed directly on the lens surface.

Figure 1B:
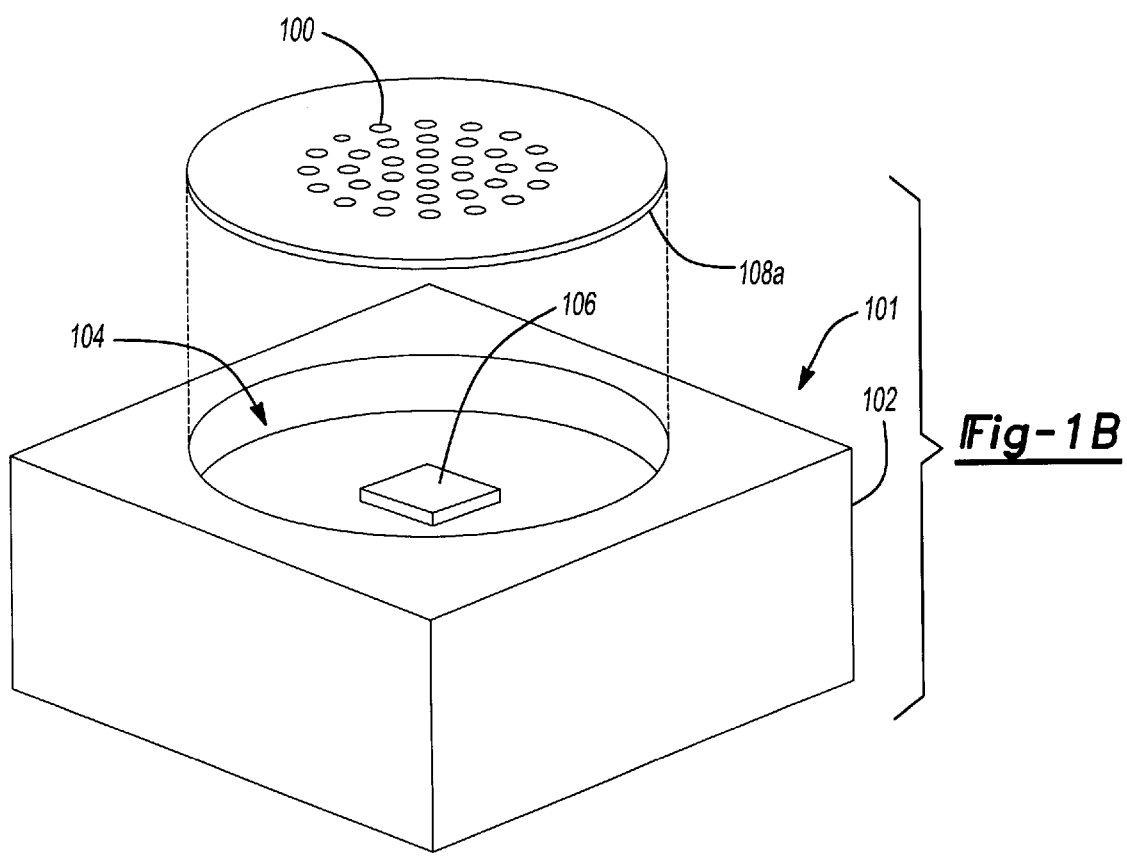

The LED lens 108 can either be integrally formed into the LED structure, as shown in FIG. 1a, or manufactured as a separate cap 108a or film that can be snapped or otherwise adhered onto the LED carrier 102, as shown in FIG. 1b. If the LED lens 108 is manufactured as a cap 110, a manufacturer can create caps having different hues and transparencies to shift the intrinsic LED color and/or adjust the luminance in conjunction with the filter 100.

FIG. 2 illustrates one possible method 200 for generating a filtered LED according to the invention. The intensity and/or color of an individual LED or grouping of LEDs is measured using a colorimeter, photometer, spectrometer, spectrophotometer, or any other device that can detect light intensity and color. The data obtained from the measuring process can include data such as luminance (or alternatively light power or lumens) and/or color data such as a spectral power density curve, CIE, Cab, x,y coordinates, or any data according to any other known system.

First, LED dies are singulated from a wafer at step 202 and each die is mounted to a carrier or package at step 204. Depending on the desired LED application, the back of the die may be one electrode (not shown) and may be attached to the preformed electrodes using a conductive adhesive or solder. One or two wire bonds then connect the front of the die to the electrodes at step 206. Note that step 206 is not limited to connecting wire bonds and can encompass any LED mounting method, including those that mount LEDs that do not use any wire bonds. The plastic lens, in the form of clear epoxy, a separate cap, or any other lens structure, is then coupled to the carrier at step 208.

Normally at this stage, the LEDs are in the form of a continuous reel for easier automated handling. Once the lenses are attached, the reel is placed on a machine that detaches individual LEDs at step 210. Power is then applied to each LED at step 212 in front of a luminance and color measuring sensor to obtain a shift value representing the deviation of the LED from a desired luminance and/or color.

Once the performance of a given LED has been measured at step 212, the shift value for that LED can be used to compute the amount and type of ink as well as the type of pattern that can correct the LED's color and/or luminance. The desired filter pattern or patterns can then be applied at step 214 according to the calculations. Tolerances can be tightened by using one filter ink for a unidirectional correction, or multiple inks for greater control.

FIG. 3 shows an alternative method 300 of applying filters according to the invention. In this embodiment, the LEDs are partially or completely assembled in their final application at step 302 before they are tested and compensated for color and/or luminance. In this case, the inventive process computes correction parameters (e.g., ink color, type and amount, ink dot pattern, overlap, etc.) and then apply the correcting filters using the process discussed above with respect to FIG. 2.

Focusing on the filter application step 214 in more detail, the filter 100 is preferably applied to the LEDs or in the optical path of the LEDs to attenuate the light produced to compensate for intensity and/or color variations, or "shift values". The filter 100 can be, for example, ink or pigment applied to the lens portion of the LED or to a cap that is later attached to the LED. Because each LED may have different variations, each LED may have slight different filter characteristics to bring a group of LEDs within a selected tolerance.

The specific ink selected for the filter 100 can be chosen based on any known characteristics, such as color absorption curves, compatibility with the LED lens 108, 108a material, the dispensing method used to generate the filter 100, the desired temperature endurance for the LED, and the ink fade characteristics. Once the filter 100 characteristics have been determined based on the color and luminance shifts for a given LED, these characteristics can be used to generate a control algorithm in any known manner to direct an ink dispensing system. Note that if the filter 100 uses two or more inks, their interactions would need to be taken into account as well.

The ink itself can be a pigment or a dye, although dyes are preferred because they are less likely to scatter light and change the radiation pattern of light passing through them.

Typically, the filter 100 may require only one or two ink colors to modif color and intensity. Using two ink colors, each forming one filter, provides greater flexibility in controlling and filtering LED emissions; for example, one ink filter may attenuate longer wavelengths of the LED emission and the other ink filter may attenuate shorter wavelengths of the LED emission, thereby attenuating luminance without appreciably changing the perceived color. The specific wavelength ranges attenuated by the ink filters can be set by, for example, one or more thresholds. If the LED only requires intensity adjustments, the filter 100 may only need a single neutral density ink with respect to the LED emission. If the LED needs minimal control, the thickness and/or dye density of the filter 100 itself, without any pattern, may be enough to provide sufficient tuning. Conversely, if the LED needs more spectral control, the filter 100 may include more than two ink colors.

Multiple filters would also be appropriate if color and intensity variations have to be reduced for wide band white LEDs or for white lighting, which uses multiple colors (e.g., red, blue and green dies) either in one package or in multiple packages. Furthermore, two or more filters having the same color may be printed on the LED, adding another level of LED emission control.

For example, if the objective is to remove some red from an LED by printing individual dots of ink over an emitting area, there are a number of variables which can be manipulated to tune color. If the dots in the filter are sparsely scattered over the exit aperture of the LED, then most of the light passes through the LED lens or cap is unfiltered. The unfiltered light adds to light passing through the ink which preferentially removes some colors over others. If more of a color is to be removed, then more ink dots can be placed over the remaining clear area on the aperture or ink dots can be placed over existing ones. Thus, there are many ways in which color tuning system can be designed by picking the ink used (choosing an appropriate absorption curve), varying the amount of ink placed over the aperture, and by changing where the ink is positioned (i.e. the degree of overlapping of layers).

Once the color and/or intensity of LED illumination has been measured, the filter 100 can be placed in the LED's optical path by printing the filter 100 directly on the LED lens 108, 108a or by printing the filter 100 on a cap that is later attached to the LED. The filter 100 can also be produced using sublimation printing, direct dispensing, or any other known printing method. The filter's specific characteristics depend on the amount and type of shifting that the LED illumination needs to fall within a particular threshold.

In one embodiment of the invention, an ink jet printer deposits the filter material. Ink jet printing is a particularly fast and convenient process for printing and overprinting filters because the filters can be printed on the LEDs at virtually any time, such as during the LED manufacturing process, after LEDs have been manufactured but before they have been placed in a particular application, or even after the LEDs have been assembled into the application. During LED manufacturing, as shown in FIG. 1, the LED dies 106 are typically mounted in packages acting as the carrier 102. The manufacturing system then applies power to the mounted LEDs and measures the LED color, intensity and other properties and bins the LEDs based on these measurements. Once the properties of individual LEDs are known, the density of correction filters can be calculated in the manner explained above.

The ink jet printer can be used in several different ways to generate the filter. For example, ink jet print heads can be placed a selected distance from the target surface during printing, keeping in mind that as the distance increases from the target to the head, placement accuracy diminishes and the size of the ink droplets may increase. Further, the droplets can be steered once they leave the jet orifice by any known method, such as electrostatic deflection. Ink jet heads can be procured with multiple orifices in close proximity each being fed from different ink solutions. Ink jet heads can also be mounted to X,Y tables or drives so that the LEDs scattered over a product can be individually printed. It is also possible to move the assembled product slowly in one direction and have ink jet heads travel back and forth in the other direction to allow for full two dimensional accessibility to target LEDs. It is also possible to move the application with the LEDs already installed over a fixed print head, measure the color and luminance for each LED with a sensor or a suitable camera and then deposit a correction filter after the measurement.

Other methods incorporating known printing techniques can be used to deposit the filters 100 onto the LED lens 108, 108*a*. For example, X-Y positioning tables or other positioning devices can be used in conjunction with dispensing needles to deposit one or more inks on top of LEDs. Pad printing can be used to transfer colorant, or colored tape can be adhered to the LEDs to act as filters 100.

As a result, once the light emitted from the LED passes through the filter 100, some of the wavelengths are absorbed into the filter and lost. The resultant spectral curve is therefore different from the original, unfiltered LED.

Figure 4:
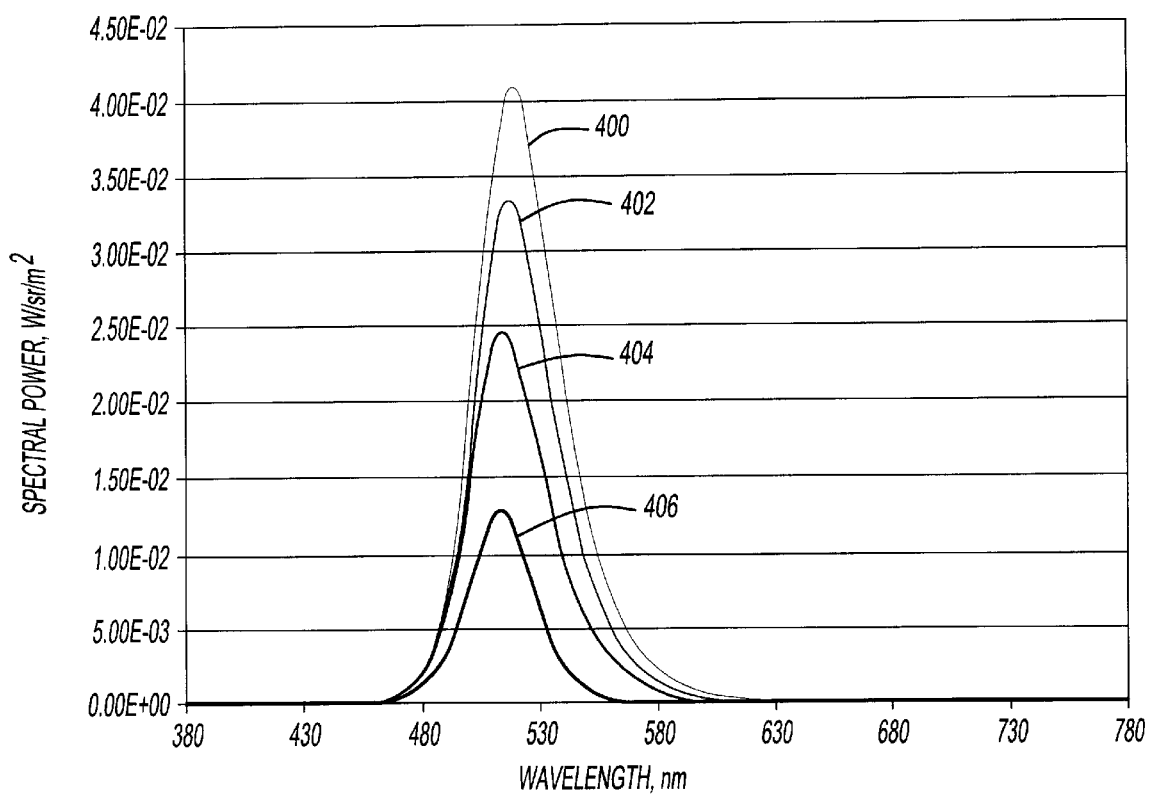
FIG. 4 is a graph illustrating an example of modified spectral characteristics of an LED filtered according to the present invention

The spectra for a green LED and three different levels of filtration are shown in FIG. 4. As is known in the art, calculating the resultant spectral curve of the filtered light involves taking the spectral energy of the source and multiplying it by the percent transmission of the filter at the same emitted wavelength. The following equation predicts the resultant spectral curve of filtered light:

$$P(\lambda_i)t(\lambda_i)=R(\lambda_i) \text{ for } i=380 \text{ to } 780 \text{ nm} \tag{1}$$

where P is the spectral power at $\lambda_i$, t is the percent transmission at $\lambda_i$ and R is the resultant spectral power at $\lambda_i$. In this example, the graph shows the spectral curve for an unfiltered green LED 400, a green LED with one blue dot 402, a green LED with 2 blue dots 404, and a green LED that is completely covered with a blue filter 406.

It should be understood that various alternatives to the embodiments of the invention described herein may be employed in practicing the invention. It is intended that the following claims define the scope of the invention and that the method and apparatus within the scope of these claims and their equivalents be covered thereby.

What is claimed is:

1. A light emitting diode (LED), comprising:
   an LED die that emits light in an optical path; and
   a filter disposed in the optical path, wherein the filter changes at least one of the color and the intensity of the emitted light,
   wherein the filter has a filter pattern that changes at least one of the color and the intensity of the emitted light, wherein the filter pattern is generated based on a shift value corresponding to a deviation between at least one of the color and intensity of the emitted light from a reference,
   further comprising a lens in the optical path, wherein the filter pattern is a printed ink pattern on a surface of the lens,
   wherein the printed ink pattern includes at least one of a first pattern in a first ink color, a second pattern in a second ink color, and a third pattern in a neutral density ink,
   wherein the first pattern attenuates wavelengths longer than a first threshold and the second pattern attenuates wavelengths shorter than a second threshold.

2. The LED of claim 1, wherein the lens is a cap disposed in a spaced relationship with respect to the LED die, wherein the filter is applied to the cap.

3. The LED of claim 1, wherein the lens is a film disposed in a space relationship with respect to the LED die, wherein the filter is applied to the film.

4. The LED of claim 1, wherein the LED die is disposed inside a cavity on a LED carrier, and wherein the lens is a clear material covering the LED die to act as the lens, wherein the filter is applied to the clear material.

5. The LED of claim 4, wherein the clear material is a clear epoxy.

6. LED of claim 1, wherein the filter pattern is printed on the lens via ink-jet printing.

7. The LED of claim 1, wherein the printed ink pattern includes the first and second patterns, and wherein the first and second patterns together attenuate both the color and intensity of the emitted light.

8. An apparatus having at least one light emitting diode (LED), comprising:
   at least one LED die that emits light in an optical path;
   at least one LED lens in the optical path of said at least one LED die; and
   at least one filter disposed on said at least one LED lens, wherein the filter is a printed ink pattern that changes at least one of the color and the intensity of the emitted light, wherein the filter pattern is generated based on a shift value corresponding to a deviation between at least one of the color and intensity of the emitted light from a reference,
   wherein the printed ink pattern includes at least one of a first pattern in a first ink color, a second pattern in a second ink color, and a third pattern in a neutral density ink,
   wherein the first pattern attenuates wavelengths longer than a first threshold and the second pattren attenuates wavelengths shorter than a second threshold.

9. The apparatis of claim 8, wherein the lens is a cap disposed in a spaced relationship with respect to the LED die, wherein the filter is applied to the cap.

10. The LED of claim 8, wherein the lens is a film disposed in a spaced relationship with respect to the LED die, wherein the filter is applied to the film.

11. The LED of claim 8, wherein the LED die is disposed inside a cavity on a LED carrier, and wherein the lens is a clear material covering the LED die to act as the lens, wherein the filter is applied to the clear material.

12. The LED of claim 11, wherein the clear material is a clear epoxy.

13. The apparatus of claim 8, wherein the filter pattern is printed on the lens via ink-jet printing.

14. The LED of claim 8, wherein the printed ink pattern includes the first and second patterns, and wherein the first and second patterns together attenuate both the color and intensity of the emitted light.

* * * * *